(12) United States Patent
Maruo (10) Patent No.: US 8,003,892 B2
(45) Date of Patent: Aug. 23, 2011

(54) PRINT CIRCUIT SUBSTRATE AND CONNECTION CONFIGURATION OF THE SAME

(75) Inventor: Hiroki Maruo, Sakura (JP)

(73) Assignee: Fujikura Ltd., Tokyo (JP)

( * ) Notice: Subject to any disclaimer, the term of this patent is extended or adjusted under 35 U.S.C. 154(b) by 438 days.

(21) Appl. No.: 11/686,145

(22) Filed: Mar. 14, 2007

(65) Prior Publication Data
US 2007/0254497 A1    Nov. 1, 2007

(30) Foreign Application Priority Data

Mar. 27, 2006  (JP) .................. 2006-085631

(51) Int. Cl.
*H05K 1/11*    (2006.01)
(52) U.S. Cl. ........................................ 174/254; 174/260
(58) Field of Classification Search ................ 174/254, 174/255, 260, 261
See application file for complete search history.

(56) References Cited

U.S. PATENT DOCUMENTS

| 4,950,527 A * | 8/1990 | Yamada .................... 428/192 |
| 6,002,172 A * | 12/1999 | Desai et al. .................... 257/737 |
| 6,527,162 B2 * | 3/2003 | Totani et al. .................. 228/175 |

FOREIGN PATENT DOCUMENTS

| JP | 08-023147 A | 1/1996 |
| JP | 2800691 B2 | 7/1998 |
| JP | 2001-339146 A | 12/2001 |
| JP | 2002-134861 A | 5/2002 |
| JP | 2003-008187 A | 1/2003 |

* cited by examiner

*Primary Examiner* — Ishwarbhai B Patel
(74) *Attorney, Agent, or Firm* — Sughrue Mion, PLLC

(57) ABSTRACT

A print circuit substrate is composed of a base material, a wiring pattern formed on the base material, the wiring pattern constituting a predetermined circuit pattern, and a connection terminal of a shape narrowing toward an end thereof, the connection terminal being formed on the base material and extending from the wiring pattern.

10 Claims, 6 Drawing Sheets

PRINT CIRCUIT SUBSTRATE AND CONNECTION CONFIGURATION OF THE SAME

CROSS REFERENCE TO RELATED APPLICATION

This application claims priority under 35 U.S.C. §119 to Japanese Patent Application No. 2006-085631, filed on Mar. 27, 2006, the entire contents of which are incorporated by reference herein.

BACKGROUND

The present invention relates to a print circuit substrate and a connection configuration of the print circuit substrate, specifically, the print circuit substrate and the connection configuration employing a solder for connection.

DESCRIPTION OF THE RELATED ART

There has been known a method of connecting a rigid substrate and a flexible substrate by soldering connection terminals with each other, the connection terminals being provided respectively on the rigid substrate and the flexible substrate. In such a method, a solder is provided on a surface of at least one of the connection terminals; a flux is applied thereon in order to facilitate soldering; both substrates to be connected are laid on each other; and the substrates are heated at a predetermined temperature while applying a predetermined pressure.

As miniaturization of a print circuit substrate or reduction in wiring pitch are progressing, solder bridging that short-circuits adjacent wirings may take place more frequently. As a countermeasure against this problem, there has been disclosed a technology where a connection terminal on a flexible substrate is made narrower so as to ensure a relatively larger space that serves as a solder pool for a solder fillet to be made (see, Japanese Patent Publication No. 2,800,691).

In soldering, a solder fillet is generally formed on or on a side of the connection terminal. For example, the above publication discloses a solder fillet formed due to a difference in width between connection terminals provided respectively on a rigid substrate and a flexible substrate to be connected with each other. In this case, as a pitch of the connection terminals decrease, it becomes difficult to maintain a sufficient space for the solder fillet when differentiating a width between the connection terminals. This may create solder bridging more frequently and thus short-circuiting.

The present invention has been made in view of the above disadvantage, and an aspect thereof is to provide a print circuit substrate and a connection configuration that allows for a sufficiently large solder pool where an excessive amount of solder can remain so as to form a large fillet therein.

SUMMARY OF EXEMPLARY EMBODIMENTS OF THE INVENTION

A first aspect of the present invention provides a print circuit substrate having a base material, a wiring pattern formed on the base material, the wiring pattern constituting a predetermined circuit pattern, and a connection terminal of a shape that narrows toward a distal end thereof, the connection terminal being formed on the base material and extending from the wiring pattern.

Another aspect of the present invention provides a connection configuration having a first connection terminal formed on a first substrate and extending from a first wiring pattern formed on the first substrate, the first connection terminal having a shape that narrows toward a distal end thereof, a second connection terminal formed on a second substrate and extending from a second wiring pattern provided on the second substrate, the second connection terminal arranged so as to oppose the first connection terminal, and a fillet formation portion allowing a fillet to be formed on surfaces of the first and the second connection terminal.

According to the present invention, there is provided a print circuit substrate and a connection configuration that allows for a sufficiently large solder pool where an excessive amount of solder can remain so as to form a large fillet therein.

DETAILED DESCRIPTION OF EXEMPLARY EMBODIMENTS OF THE INVENTION

Non-limiting, exemplary embodiments of the present invention will now be described with reference to the accompanying drawings. In the drawings, the same or corresponding reference marks are given to the same or corresponding members or components. It is to be noted that the drawings are illustrative of the invention, and there is no intention to indicate scale or relative proportions among the members or components, or between thicknesses of various layers, alone or therebetween. Therefore, the specific thickness or size should be determined by a person having ordinary skill in the art in view of the following non-limiting embodiments.

A First Non-Limiting Embodiment

Figure 1A:
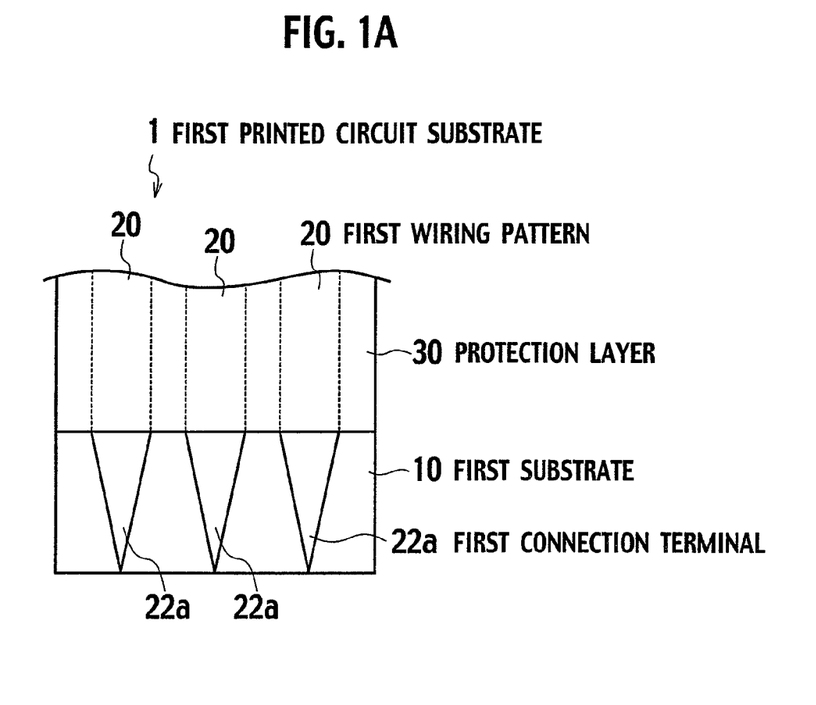
FIGS. 1A and 1B are a schematic view of a print circuit substrate according to a first non-limiting embodiment of the present invention.

As shown in FIG. 1, a first print circuit substrate 1, as a print circuit substrate according to a first non-limiting embodiment of the present invention, is composed of a first substrate 10, a first wiring pattern 20 provided on an upper surface of the first substrate 10 so as to constitute a predetermined circuit pattern, and a first connection terminal 22a that is provided on the same upper surface and extends from the first wiring pattern 20.

Figure 1B:
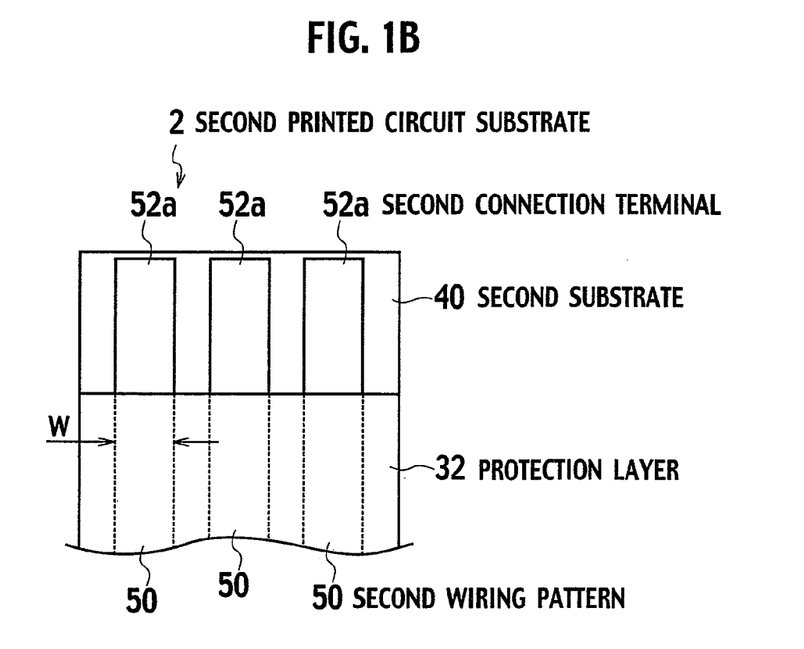

In this embodiment, the first circuit substrate 1 is to be connected with a second print circuit substrate 2 shown in FIG. 1B. The second print circuit substrate 2 is composed of a second substrate 40, a second wiring pattern 50 provided on an upper surface of the second substrate 40 so as to constitute a predetermined circuit pattern, and a second connection terminal 52a that is provided on the same upper surface and extends from the second connection terminal 52a.

The first substrate 10 and the second substrate 40 are both an insulating substrate and may be composed as a rigid substrate or a flexible substrate, although at least one of them is preferably a flexible substrate. When realized as a rigid substrate, there can be used a material such as a glass-epoxy substrate, a glass-composite substrate, a paper-epoxy substrate or the like. On the other hand, when realized as a flexible substrate, there can be used a material such as a polyimide substrate, a polyethylene telephthalate (PET) substrate, a polyethylene naphthalate (PEN) substrate or the like. The rigid substrate can have a thickness of 2.4 mm, 2.0 mm, 1.6 mm, 1.2 mm, 1.0 mm, 0.8 mm, 0.6 mm or the like. The flexible substrate can have a thickness of 25 μm, 12.5 μm, 8 μm, 6 μm or the like.

The first wiring pattern 20 is formed of an electrically conductive material on the first substrate 10 and constitutes a predetermined circuit pattern. Similarly, the second wiring pattern 50 is formed of an electrically conductive material on the second substrate 40 and constitutes a predetermined circuit pattern. Specifically, the first wiring pattern 20 and the second wiring pattern 50 are formed, for example, by patterning a rolled copper foil or an electro-plated copper foil on the first substrate 10 and the second substrate 40, respectively. It goes without saying that the first wiring pattern 20 and the second wiring pattern 50 can be formed of other metal foils. Example dimensions of the first wiring pattern 20 and the second wiring pattern 50 include a width from 10 to 500 μm; a separation between lines from 10 to 500 μm; and a thickness of about 35 μm, 18 μm, 12 μm, 9 μm or the like.

The first connection terminal 22a is extending from the first wiring pattern 20 provided on the surface of the first substrate 10 of the first print circuit substrate 1 and electrically connected with the first wiring pattern 20. In other words, the first connection terminal 22a constitutes an end portion of the first wiring pattern 20. The first connection terminal 22a has a taper shape that becomes gradually narrower towards the end thereof, as shown in FIG. 1A.

Figure 2:
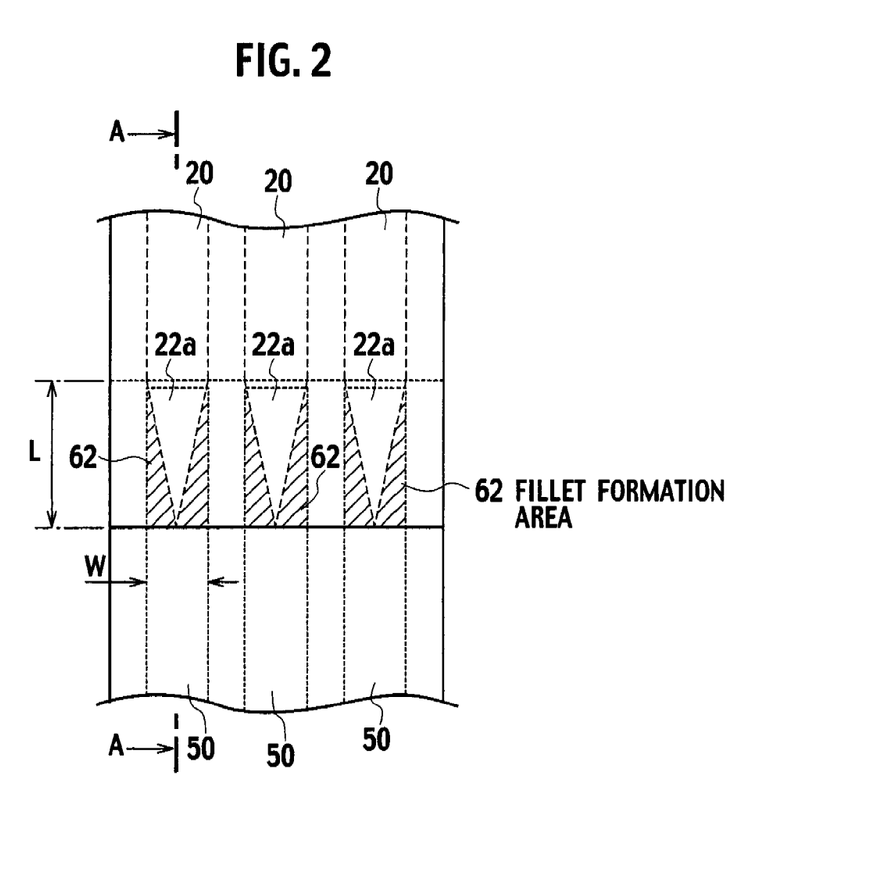
FIG. 2 is a schematic view of a connection configuration of the print circuit substrates according to the first non-limiting embodiment of the present invention.
Figure 3:
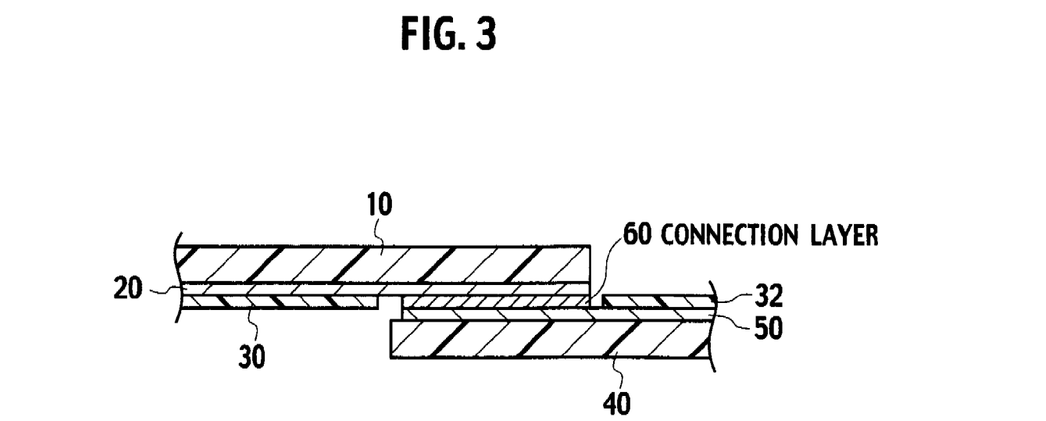
FIG. 3 is a cross-sectional view taken along a line A-A in FIG. 2.

The second connection terminal 52a is extending from the second wiring pattern 50 provided on the surface of the second substrate 40 of the second print circuit substrate 2 and electrically connected with the second wiring pattern 50. In other words, the second connection terminal 52a constitutes an end portion of the second wiring pattern 50. The second connection terminal 52a is provided so as to oppose the first connection terminal 22a when the first print circuit substrate 1 and the second print circuit substrate 2 are connected with each other as shown in FIGS. 2 and 3. In addition, the second connection terminal 52a is not tapered, differently from the first connection terminal 22a, and has a constant width (W shown in FIG. 1B) along the longitudinal direction in this non-limiting embodiment. Namely, the second connection terminal 52a has a rectangular shape, as shown in FIG. 1B.

The first connection terminal 22a and the second connection terminal 52a are formed concurrently when the first wiring pattern 20 and the second wiring pattern 50, respectively, in the same manner. While the first wiring pattern 20 and the second wiring pattern 50 are covered respectively by a protection layer 30, 32 made of an insulating resilient material or the like, the first connection terminal 22a and the second connection terminal 52a remain exposed. Though exposed, the first connection terminal 22a and the second connection terminal 52a are subjected to a surface treatment such as a pre-flux treatment, a hot-air leveler, an electroplating solder, a non-electroplating solder or the like. By the way the protection layer 30, 32 can be made of a resist or a coverlay composed of an insulating polyimide film or the like as a base material, which has an excellent flexibility even after adhesion.

According to the print circuit substrate according to the first non-limiting embodiment, since a strict tolerance in dimension is unnecessary as far as the first connection terminal 22a becomes narrower toward the end thereof, the first connection terminal 22a can be formed with ease, compared with a situation where a connection terminal has to have a constant width.

In a connection configuration according to this embodiment employing the first print circuit substrate 1 and the second print circuit substrate 2, the first print circuit substrate 1 and the second circuit substrate 2 are connected with each other by forming a connection layer 60 by use of solder or the like, as shown in FIG. 3, which is a cross-sectional view taken along a line A-A in FIG. 2. When the first print circuit substrate 1 and the second print circuit substrate 2 oppose each other after connected, there is produced a fillet formation region 62 in or around the first connection terminal 22a and the second connection terminal 52a, as shown in FIG. 2.

There will be described a method for connecting the first print circuit substrate 1 and the second print circuit substrate 2 hereinafter. While various methods can be adopted for connecting the substrates, a solder fusion bonding will be employed for this non-limiting embodiment.

First of all, a solder is adhered on at least one of the first connection terminal 22a, provided on the first substrate 10, and the second connection terminal 52a provided on the second substrate 40. This can be carried out by plating a solder thereon in advance, or screen-printing a cream solder thereon in advance. Additionally, a lead-containing solder paste, a lead-free solder paste, a solder plating, a tin plating or the like can be employed.

Next, the first substrate 10 and the second substrate 50 are laid on each other so that the first connection terminal 22a and the second connection terminal 52a oppose each other with the solder therebetween, as shown in FIG. 2. Then, a fusion machine (not shown) is used to heat, through the first substrate 10 and the second substrate 50, the solder to be melted. After the solder is cooled, the solder becomes the connection layer 60 that electrically connects the first connection terminal 22a and the second connection terminal 52a, as shown in FIG. 3.

When the first connection terminal 22a and the second connection terminal 52a are connected, the fillet formation region 62 comes to have an area determined by a width W and a length L of the connection terminals 22a, 52a, as shown in FIG. 2. Namely, the area is expressed by LW/2 when the first connection terminal 22a and the second connection terminal 52a are overlaid on each other without a lateral deviation.

According to the connection configuration of the print circuit substrate of the first non-limiting embodiment, since the first connection terminal 22a is tapered toward the end thereof, the fillet formation region 62 can have a relatively large area even when a separation between the connection terminals is small, thereby providing enough space for a redundant solder to remain therein. Such a sufficient space can prevent a solder bridge from causing short-circuit between any one of the connection terminals 22a, 52a and the adjacent terminals.

A Second Non-Limiting Embodiment

In a second non-limiting embodiment, a second connection terminal 52b (see FIG. 4B), provided on the print circuit substrate 2, becomes narrower toward the end thereof, which is different from the second connection terminal 52a shown in FIG. 1B in the first non-limiting embodiment. Except for this difference, the second non-limiting embodiment is substantially identical to the first non-limiting embodiment. The following description is focused on the difference and undue repetition of explanation is omitted.

Figure 5A:
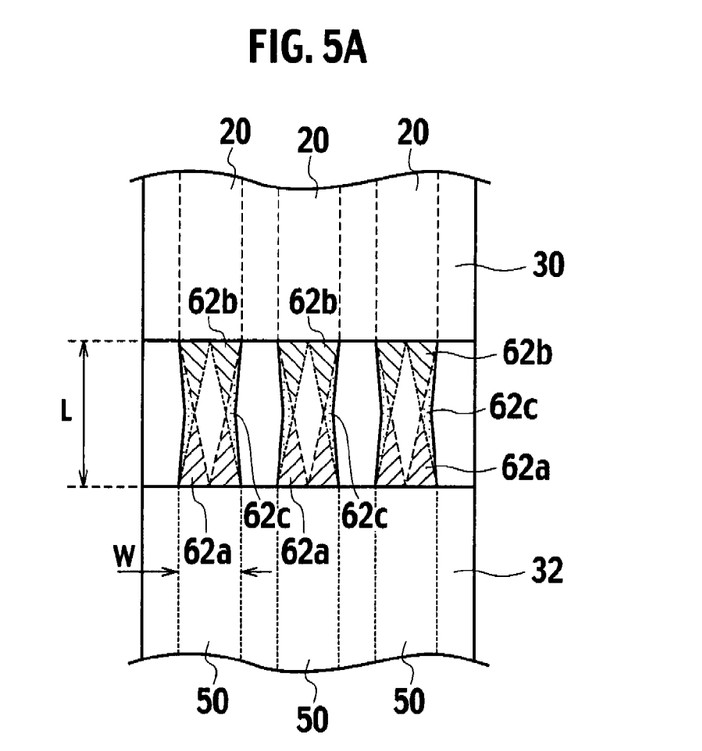
FIGS. 5A and 5B are a schematic view of a connection configuration of the print circuit substrates according to the second non-limiting embodiment of the present invention.
Figure 5B:
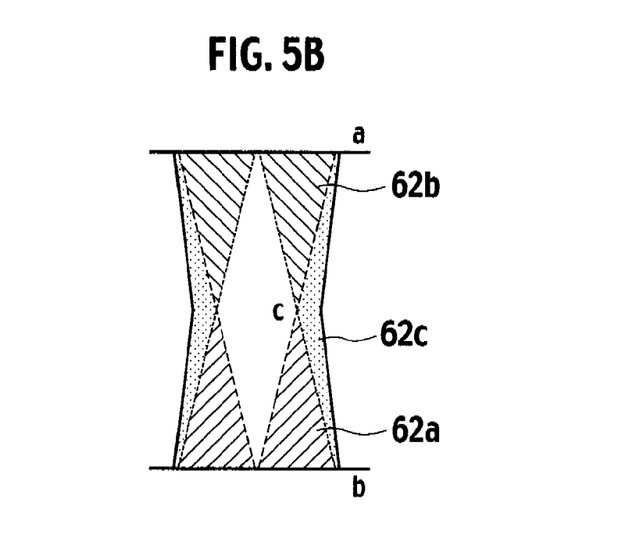

The first print circuit substrate 1 and the second print circuit substrate 2 are connected with each other as shown in FIG. 5A. FIG. 5B shows a substantial part thereof in magnification. As shown, fillet formation regions 62a, 62b, which allow a solder fillet to be produced, are provided on the surfaces where the first connection terminal 22a and the second connection terminal 52b are respectively formed. In other words, the fillet formation regions 62a, 62b correspond to a portion where the first connection terminal 22a and the second connection terminal 52b are not overlapped. The fillet formation regions 62a, 62b have an area of LW/2 in total, which is equal to the area of the fillet formation region 62 shown in FIG. 2 in the first non-limiting embodiment.

In addition, this connection configuration according to the second non-limiting embodiment has an additional fillet formation region 62c, lateral to the first connection terminal 22a and the second connection terminal 52b. It should be noted that the fillet formation region 62c and the solder fillet formed therein are to remain inside of a triangular area due to a surface tension of the solder, as shown in FIG. 5B. The triangular area is defined by an intersection a of the first connection terminal 22a with the edge of the protection film 30, an intersection b of the second connection terminal 52b with the edge of the protection film 32, and an intersection c of the first connection terminal 22a with the second connection terminal 52b.

According to the connection configuration employing the print circuit substrates 1, 2 of the second non-limiting embodiment, the first connection terminal 22a and the second connection terminal 52b both have a taper shape that becomes narrower toward the end, which allows the fillet formation regions 62a, 62b, 62c to have a relatively large area even if the connection terminals are provided densely. Therefore, a relatively large amount of redundant solder can remain therein, which can prevent solder bridging from being produced between any one of the connection terminals 22a, 52b and the adjacent terminals.

Furthermore, the redundant solder can be contained within the triangular area defined by the intersections a, b, c, thereby further preventing solder bridging between the adjacent connection terminals even if an excessive amount of solder is used.

A Third Non-Limiting Embodiment

Figure 6:
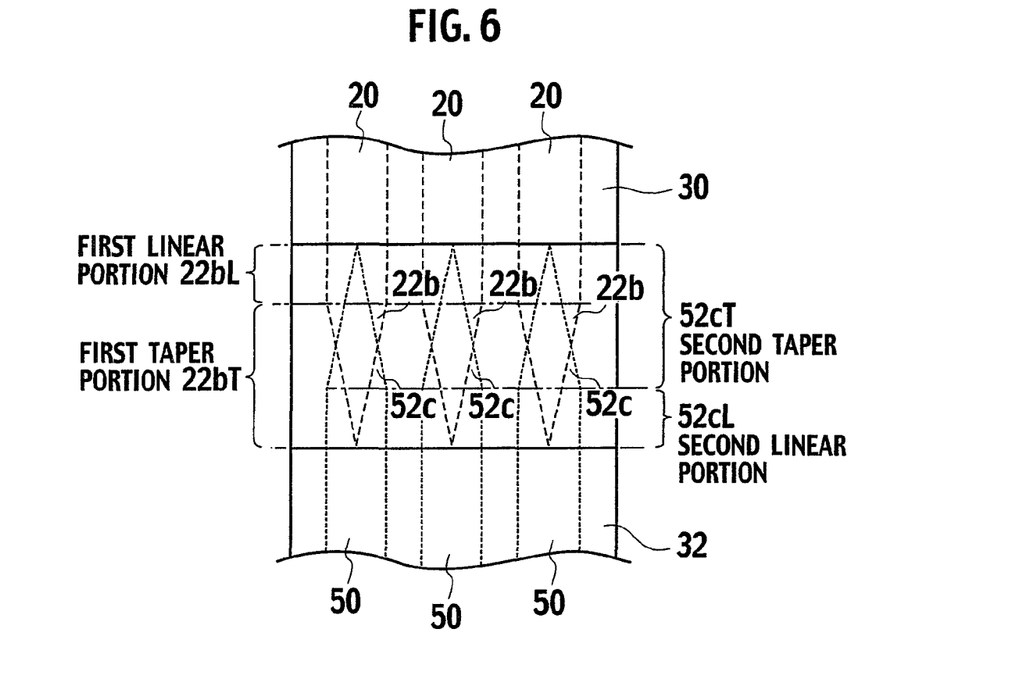
FIG. 6 is a schematic view of a connection configuration of the print circuit substrates according to a third non-limiting embodiment of the present invention.
Figure 7:
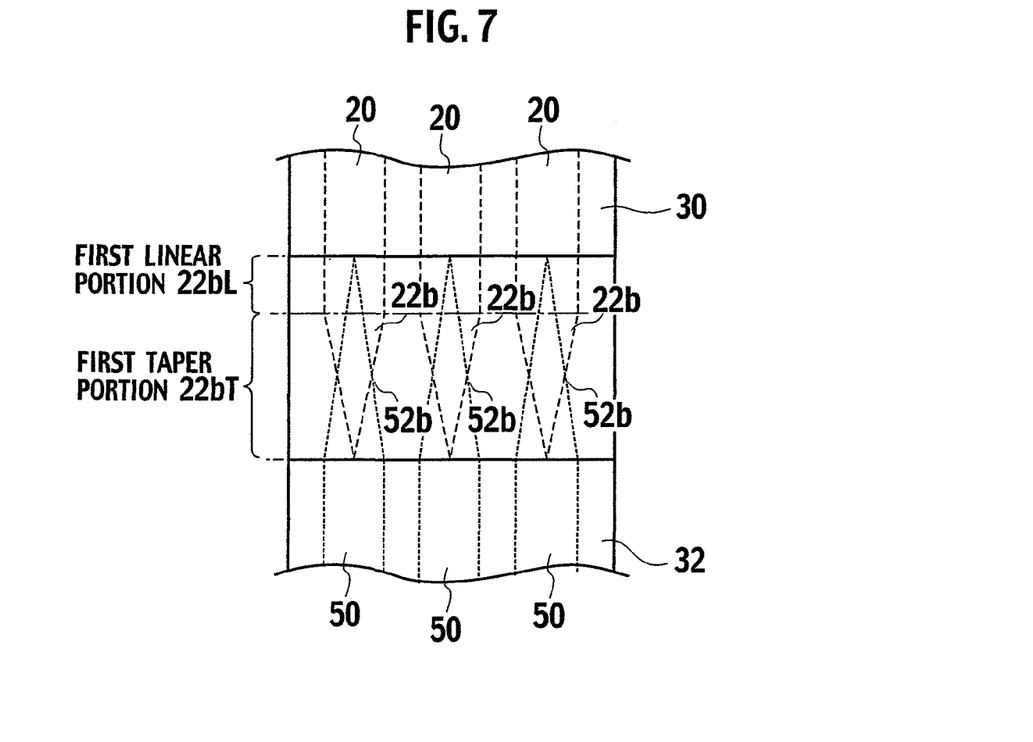
FIG. 7 is another schematic view of the connection configuration of the print circuit substrates according to the third non-limiting embodiment of the present invention.

In a third non-limiting embodiment, a first connection terminal 22b provided on the first print circuit substrate 1 and a second connection terminal 52c provided on the second print circuit substrate 2 have both a taper portion and a linear portion, as shown in FIG. 6, which is different from those in the first and the second embodiment. Except for this difference, the third embodiment is substantially identical to the first and the second embodiment. The following description is focused on the difference and undue repetition of explanation is omitted.

The first connection terminal 22b has a first linear portion 22bL that contacts with the first wiring pattern 20 and a first taper portion 22bT formed to be continuous with the first linear portion 22bL. Similarly, the second connection terminal 52c has a second linear portion 52cL that contacts with the second wiring pattern 50 and a second taper portion 52cT formed to be continuous with the second linear portion 52cL.

As shown in FIG. 6, the first linear portion 22bL and the second linear portion 52cL are not tapered and have a constant width along the longitudinal direction thereof. The first linear portion 22bL and the second linear portion 52cL are not covered by the protection films 30, 32 and are exposed, serving as a connection terminal. The first linear portion 22bL and the second linear portion 52cL can have a length designed arbitrarily.

The first taper portion 22bT and the second taper portion 52cT become gradually narrower toward the end thereof and the length thereof can be arbitrarily designed.

By the way, the first connection terminal 22b and the second connection terminal 52c are not necessarily identical to each other in terms of their shape in the third non-limiting embodiment. For example, it is possible to have a combination of the first connection terminal 22b, which has the first linear portion 22bL and the first taper portion 22bT, and the second connection terminal 52b, which is tapered along the whole length, shown in FIG. 4B in the second embodiment.

According to the connection configuration of the third non-limiting embodiment, since a solder fillet can be produced on the surfaces of, and in a lateral portion to, the first connection terminal 22b and the second connection terminals 52b, 52c, the same effect as the second embodiment is demonstrated. Moreover, the effect can be optimized by designing arbitrarily a shape of the first connection terminal 22b and the second connection terminals 52b, 52c, in view of an amount of solder to be used. Furthermore, since the first connection terminal 22b and the second connection terminals 52b, 52c may have various shapes, a greater freedom of design is obtained.

Other Non-Limiting Embodiments

Although the present invention has been described presenting several embodiments, it should be noted that the above description and drawings are not limiting.

Figure 4A:
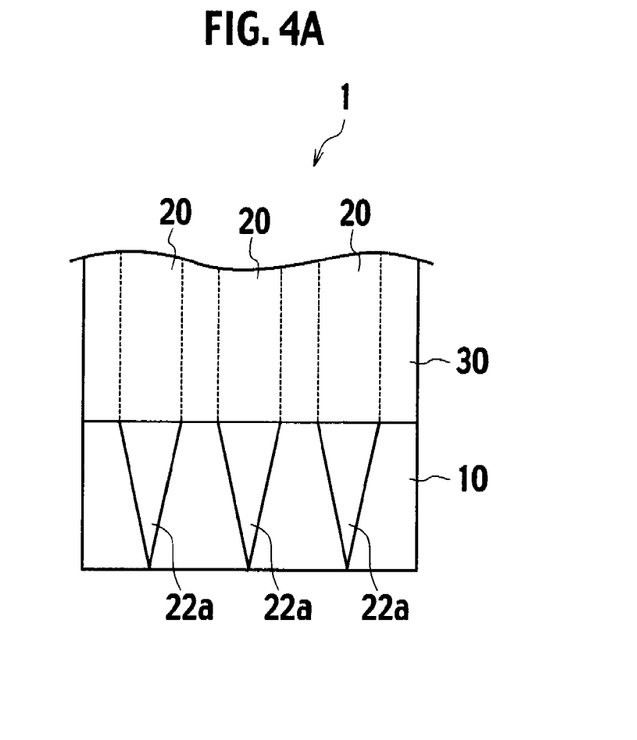
FIGS. 4A and 4B are a schematic view of a print circuit substrate according to a second non-limiting embodiment of the present invention.
Figure 4B:
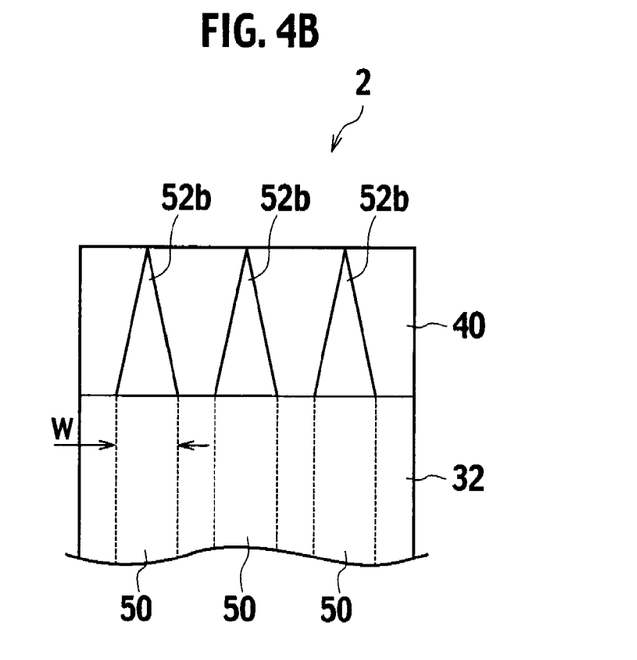
Figure 8A:
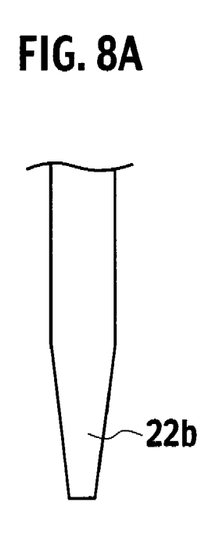
FIGS. 8A to 8C are a schematic view illustrating a shape of a connection terminal according to another non-limiting embodiment of the present invention.
Figure 8B:
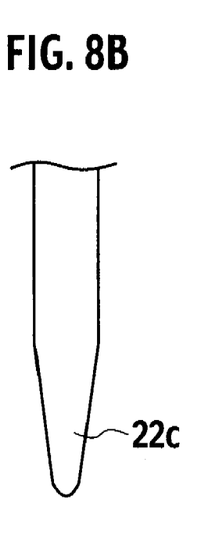
Figure 8C:
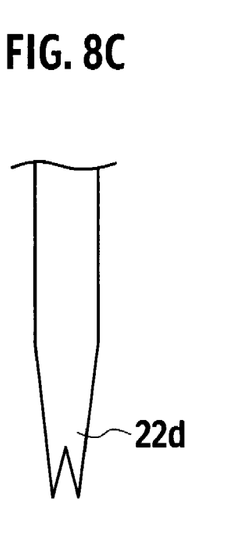

For example, although the first connection terminal 22a shown in FIGS. 1A and 4A is tapered having a pointed tip at the end, the first connection terminal 22a can have a flat end as shown in FIG. 8A. In other words, the first connection terminal 22a can be trapezoidal as a whole. In addition, the first connection terminal 22a may have a round end as shown in FIG. 8B or a branched end as shown in FIG. 8C. Furthermore, while the first connection terminal 22a shown in FIG. 8C is branched off into two portions at the end, it may be branched into more than two portions. Since the connection terminal can be formed as shown in FIGS. 8A to 8C, it allows for a greater freedom of design as far as the terminal becomes gradually narrower toward the end thereof.

Furthermore, a second connection terminal provided on the second print substrate 2 (i.e., 52a, 52b, 52c) can have the same shape as the first connection terminal 22a described above. In addition, the first connection terminal 22a may have a plurality of branches each having a trapezoidal shape.

In view of the above, it should be comprehended that the present invention may comprise various non-limiting embodiments that have not been disclosed herein. The invention is, therefore, encompassed in any of its forms or modifications within the proper scope of the appended claims when appropriately interpreted in accordance with the doctrine of equivalents.

What is claimed is:

1. A print circuit substrate being connectable with a second print circuit substrate that has a second connection terminal extending from a second wiring pattern, the print circuit substrate comprising:
   a base material,
   a first wiring pattern formed on the base material, the first wiring pattern constituting a predetermined circuit pattern, and
   a first connection terminal having a tapered shape that narrows toward a distal end thereof throughout its entire length, the first connection terminal being formed on the base material and extending from the first wiring pattern, wherein
   the first connection terminal is able to oppose the second connection terminal of the second print circuit substrate,
   a fillet defined by the tapered shape of the first connection terminal is formed as the first connection terminal and the second connection terminal are connected; and
   a distal portion of the first connection terminal is narrower than a proximal end portion of the second connection terminal, wherein
   the fillet formation area of the first connection terminal and the second connection terminal is defined by LW/2, where W is a width thereof and L is a length thereof.

2. The print circuit substrate as recited in claim 1, wherein the distal end of the connection terminal is flat.

3. The print circuit substrate as recited in claim 1, wherein the distal end of the connection terminal is round.

4. The print circuit substrate as recited in claim 1, wherein the distal end of the connection terminal is branched off into more than one portion.

5. The print circuit substrate as recited in claim 1, wherein a principal surface of each of the first connection terminal and the second connection terminal is planar.

6. A connection configuration comprising:
   a first connection terminal formed on a first substrate and extending from a first wiring pattern formed on the first substrate, the first connection terminal having a tapered shape that narrows toward a distal end thereof throughout its entire length,
   a second connection terminal formed on a second substrate and extending from a second wiring pattern provided on the second substrate, the second connection terminal arranged so as to oppose the first connection terminal, and
   a fillet formation portion allowing a fillet to be formed on surfaces of the first and the second connection terminal as the first connection terminal and the second connection terminal are connected, the fillet defined by the tapered shape of the first connection terminal, wherein
   a distal portion of the first connection terminal is narrower than a proximal end portion of the second connection terminal, wherein
   the fillet formation area of the first connection terminal and the second connection terminal is defined by LW/2, where W is a width thereof and L is a length thereof.

7. The connection configuration as recited in claim 6, wherein the second connection terminal has a shape that narrows toward a distal end thereof.

8. The connection configuration as recited in claim 7, wherein the fillet formation portion is positioned lateral to the first and the second connection terminals.

9. The connection configuration as recited in claim 7, wherein the second connection terminal has a constant-width portion.

10. The connection configuration as recited in claim 6, wherein the first connection terminal is connected to the second connection terminal via solder, and the fillet formation portion provides a space for excess solder to remain therein, so as to prevent formation of a solder bridge between adjacent pairs of first and second connection terminals.

* * * * *